United States Patent
McGrew

(10) Patent No.: US 7,359,218 B2
(45) Date of Patent: Apr. 15, 2008

(54) METHOD AND APPARATUS FOR CABLE MANAGEMENT

(75) Inventor: Allison McGrew, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 51 days.

(21) Appl. No.: 11/204,659

(22) Filed: Aug. 16, 2005

(65) Prior Publication Data

US 2007/0076403 A1 Apr. 5, 2007

(51) Int. Cl.
*H02B 1/20* (2006.01)

(52) U.S. Cl. .................. 361/826; 361/827; 174/69; 211/26; 248/282.1

(58) Field of Classification Search ........ 361/825–827; 211/26; 248/282.1, 289.11; 174/68.1, 70 R, 174/71, 71 R, 72 A, 72 R; 29/830
See application file for complete search history.

(56) References Cited

U.S. PATENT DOCUMENTS

| | | | | |
|---|---|---|---|---|
| 4,614,383 A | * | 9/1986 | Polley et al. ............... | 312/273 |
| 6,070,742 A | | 6/2000 | McAnally et al. | |
| 6,305,556 B1 | * | 10/2001 | Mayer .......................... | 211/26 |
| 6,407,933 B1 | | 6/2002 | Bolognia et al. | |
| 6,435,354 B1 | | 8/2002 | Gray et al. | |
| 6,600,665 B2 | * | 7/2003 | Lauchner .................... | 361/826 |
| 6,902,069 B2 | * | 6/2005 | Hartman et al. .............. | 211/26 |
| 6,945,504 B2 | * | 9/2005 | Chen et al. ............. | 248/282.1 |
| 7,009,112 B1 | * | 3/2006 | Mead et al. .................. | 174/69 |
| 2004/0079711 A1 | * | 4/2004 | Hartman et al. .............. | 211/26 |
| 2004/0120133 A1 | * | 6/2004 | Nguyen et al. ............. | 361/825 |
| 2005/0145582 A1 | * | 7/2005 | Dubon et al. ................. | 211/26 |

* cited by examiner

*Primary Examiner*—Tuan T. Dinh
*Assistant Examiner*—Dameon E. Levi
(74) *Attorney, Agent, or Firm*—Haynes and Boone, LLP

(57) ABSTRACT

A cable management apparatus includes a first cable management member. A second cable management member is pivotally coupled to the first cable management member such that the first cable management member and the second cable management member are moveable between an extended position and a retracted position, whereby the second cable management member is positioned in a vertically stacked orientation above the first cable management member in the retracted position. The cable management apparatus may be coupled to an information handling system rack in order to manage the cables for an information handling system while using a minimal amount of space behind the information handling system.

19 Claims, 11 Drawing Sheets

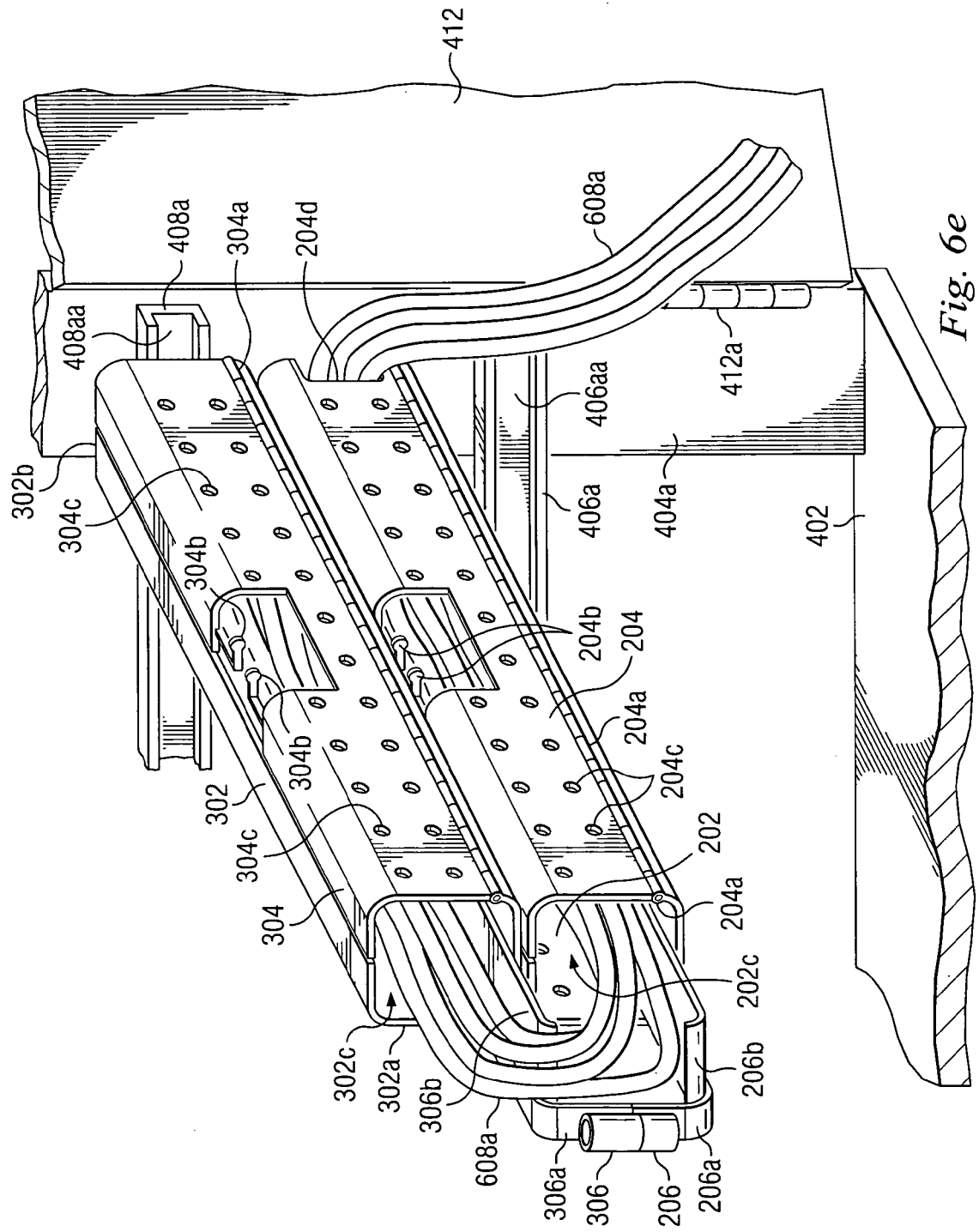

METHOD AND APPARATUS FOR CABLE MANAGEMENT

BACKGROUND

The present disclosure relates generally to information handling systems, and more particularly to cable management for an information handling system.

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Some information handling systems such as, for example, rack mounted servers, are mounted in racks to facilitate storage, use, and access to the information handling systems. As the information handling systems grow in size, they require more and more space towards the back of the racks, reducing the space available that exists between the rear of the information handling system and the back of the rack for routing the cables used with the information handling systems. Routing these cables raises a number of issues, as in addition to the need to route the cables using the space available behind the information handling system, it is also desirable to route the cables with a solution that is easy to use, doesn't block airflow through the information handling system, allows for the server to be cycled in and out of the rack, and is compatible with existing racks.

Present solutions provide either static solutions that do not allow the server to be cycled in and out of the rack or dynamic solutions that take up extra space in the rack such that larger information handling systems will not fit in the rack, with both solutions typically requiring multiple straps which must be used to couple the cables to the apparatus, making the solution more difficult to use.

Accordingly, it would be desirable to provide for cable management absent the disadvantages found in the prior methods discussed above.

SUMMARY

According to one embodiment, a cable management apparatus is provided which includes a first cable management member, and a second cable management member pivotally coupled to the first cable management member such that the first cable management member and the second cable management member are moveable between an extended position and a retracted position, whereby the second cable management member is positioned in a vertically stacked orientation above the first cable management member in the retracted position.

BRIEF DESCRIPTION OF THE DRAWINGS

FIG. 2b is a rear perspective view illustrating an embodiment of the first cable management member of FIG. 2a.

FIG. 3b is a rear perspective view illustrating an embodiment of the second cable management member of FIG. 3a.

FIG. 4 is a perspective view illustrating an embodiment of an information handling system rack used with the first cable management member of FIG. 2a and the second cable management member of FIG. 3a.

FIG. 6e is a front perspective view illustrating an embodiment of a plurality of cables coupled to the first cable management member and the second cable management member of FIG. 6c.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

Figure 1:
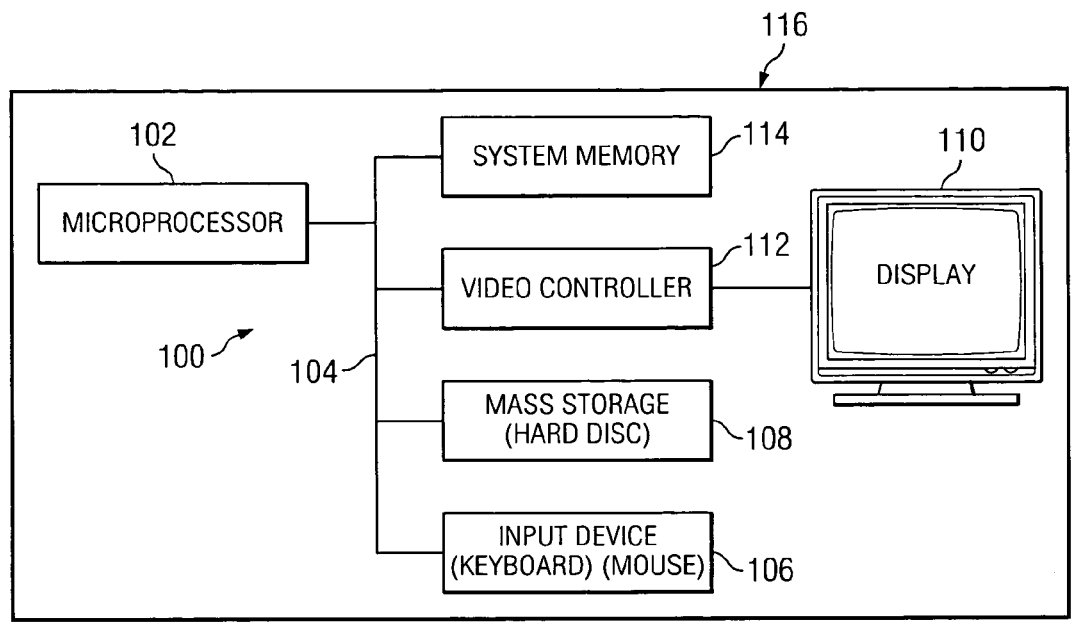
FIG. 1 is a schematic view illustrating an embodiment of an information handling system.

In one embodiment, information handling system 100, FIG. 1, includes a microprocessor 102, which is connected to a bus 104. Bus 104 serves as a connection between microprocessor 102 and other components of computer system 100. An input device 106 is coupled to microprocessor 102 to provide input to microprocessor 102. Examples of input devices include keyboards, touchscreens, and pointing devices such as mouses, trackballs and trackpads. Programs and data are stored on a mass storage device 108, which is coupled to microprocessor 102. Mass storage devices include such devices as hard disks, optical disks, magneto-optical drives, floppy drives and the like. Information handling system 100 further includes a display 110, which is coupled to microprocessor 102 by a video controller 112. A system memory 114 is coupled to microprocessor 102 to provide the microprocessor with fast storage to facilitate execution of computer programs by microprocessor 102. In an embodiment, a chassis 116 houses some or all of the components of information handling system 100. It should be understood that other buses and intermediate circuits can be deployed between the components described above and microprocessor 102 to facilitate interconnection between the components and the microprocessor.

Figure 2A:
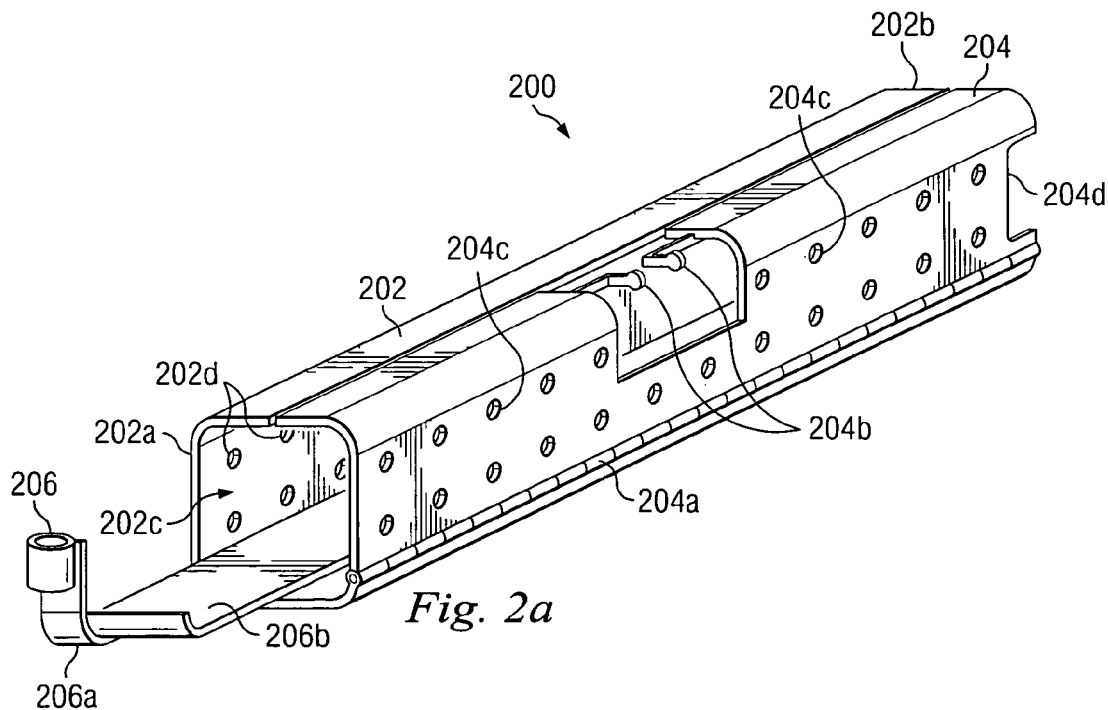
FIG. 2a is a front perspective view illustrating an embodiment of a first cable management member.
Figure 2B:
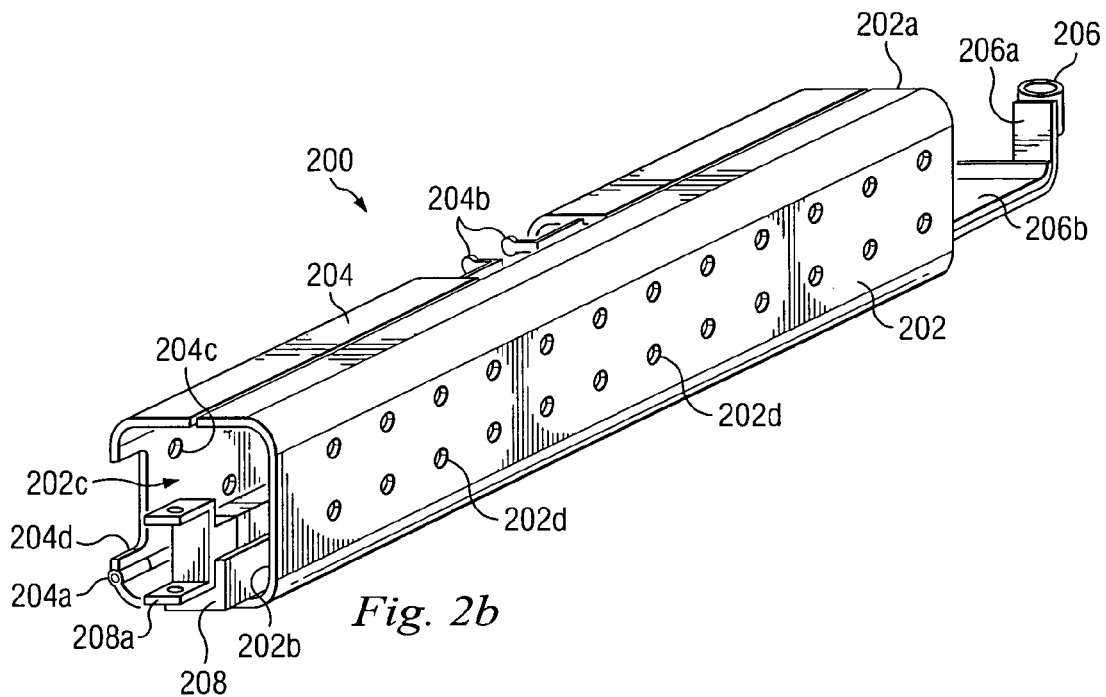

Referring now to FIGS. 2a and 2b, a first cable management member 200 is illustrated. First cable management member 200 includes an elongated tubular member 202 including a pair of opposing distal ends 202a and 202b, defining a cable passageway 202c along its length from the distal end 202a to the distal end 202b, and defining a plurality of airflow apertures 202d located in a spaced apart relationship along its length. The elongated tubular member 202 also includes a door 204 which is pivotally coupled to the elongated tubular member 202 by a hinge 204a. The door 204 includes a lock and release mechanism 204b which is centrally located on the door 204 and is operable to secure the door 204 to the elongated tubular member 202 and release the door 204 from the elongated tubular member 202. The door 204 also defines a plurality of airflow apertures 204c located in a spaced apart relationship along its length, and defines a cable entrance 204d adjacent the distal end 202b of the elongated tubular member 202. The airflow apertures 202d and 204c allow air to flow through the door 204, the cable passageway 202c, and the elongated tubular member 202. In an embodiment, the elongated tubular member 202 and the door 204 may define many more airflow apertures than are illustrated in FIGS. 2a and 2b in order to maximize the airflow through the first cable management member 200. A second member pivotal coupling 206 extends from the distal end 202a of the elongated tubular member 202 on a support beam 206a and includes a cable support surface 206b which is coupled to the support beam 206a and extends between the cable passageway 202c and the second member pivotal coupling 206. A rack coupler 208 extends from the distal end 202b of the elongated tubular member 202 and includes a rack pivotal coupling 208a pivotally coupled to the rack coupler 208.

Figure 3A:
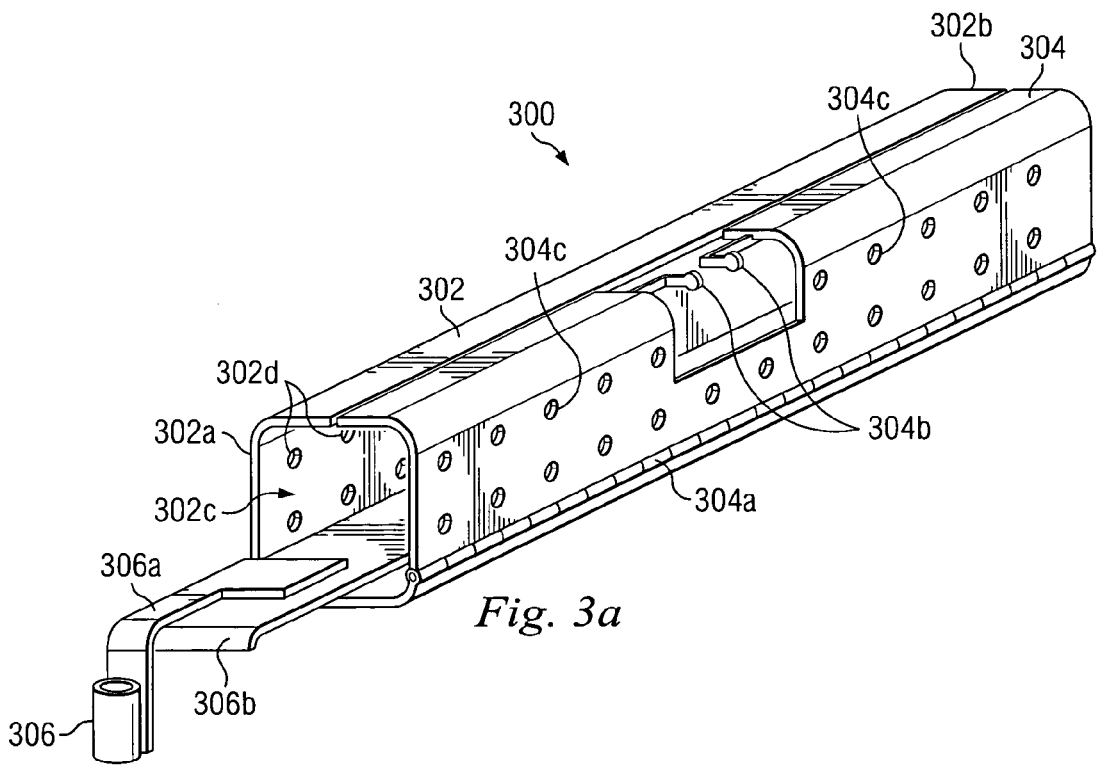
FIG. 3a is a front perspective view illustrating an embodiment of a second cable management member used with the first cable management member of FIGS. 2a and 2b.
Figure 3B:
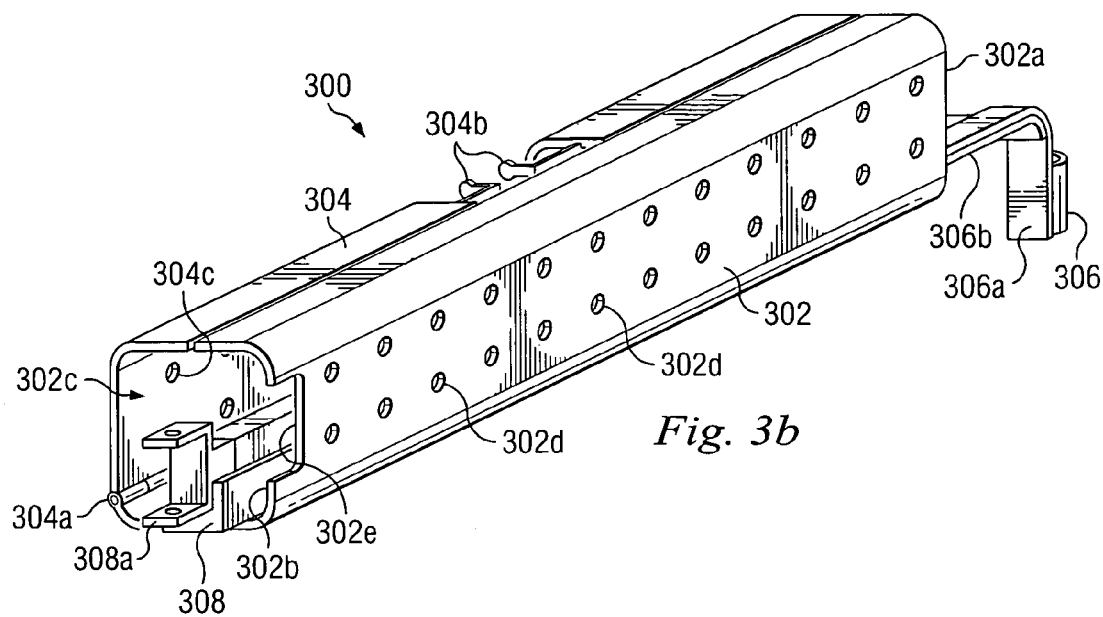

Referring now to FIGS. 3a and 3b, a second cable management member 300 is illustrated. Second cable management member 300 includes an elongated tubular member 302 including a pair of opposing distal ends 302a and 302b, defining a cable passageway 302c along its length from the distal end 302a to the distal end 302b, defining a plurality of airflow apertures 302d located in a spaced apart relationship along its length, and defining a cable exit 302e adjacent the distal end 302b of the elongated tubular member 302. The elongated tubular member 302 also includes a door 304 which is pivotally coupled to the elongated tubular member 302 by a hinge 304a. The door 304 includes a lock and release mechanism 304b which is centrally located on the door 304 and is operable to secure the door 304 to the elongated tubular member 302 and release the door 304 from the elongated tubular member 302. The door 304 also defines a plurality of airflow apertures 304c located in a spaced apart relationship along its length. The airflow apertures 302d and 304c allow air to flow through the door 304, the cable passageway 302c, and the elongated tubular member 302. In an embodiment, the elongated tubular member 302 and the door 304 may define many more airflow apertures than are illustrated in FIGS. 3a and 3b in order to maximize the airflow through the first cable management member 300. A first member pivotal coupling 306 extends from the distal end 302a of the elongated tubular member 302 on a support beam 306a and includes a cable support surface 306b which is coupled to the support beam 306a and extends between the cable passageway 302c and the first member pivotal coupling 306. An information handling system coupler 308 extends from the distal end 302b of the elongated tubular member 302 and includes an information handling system pivotal coupling 308a pivotally coupled to the information handling system coupler 308.

Figure 4:
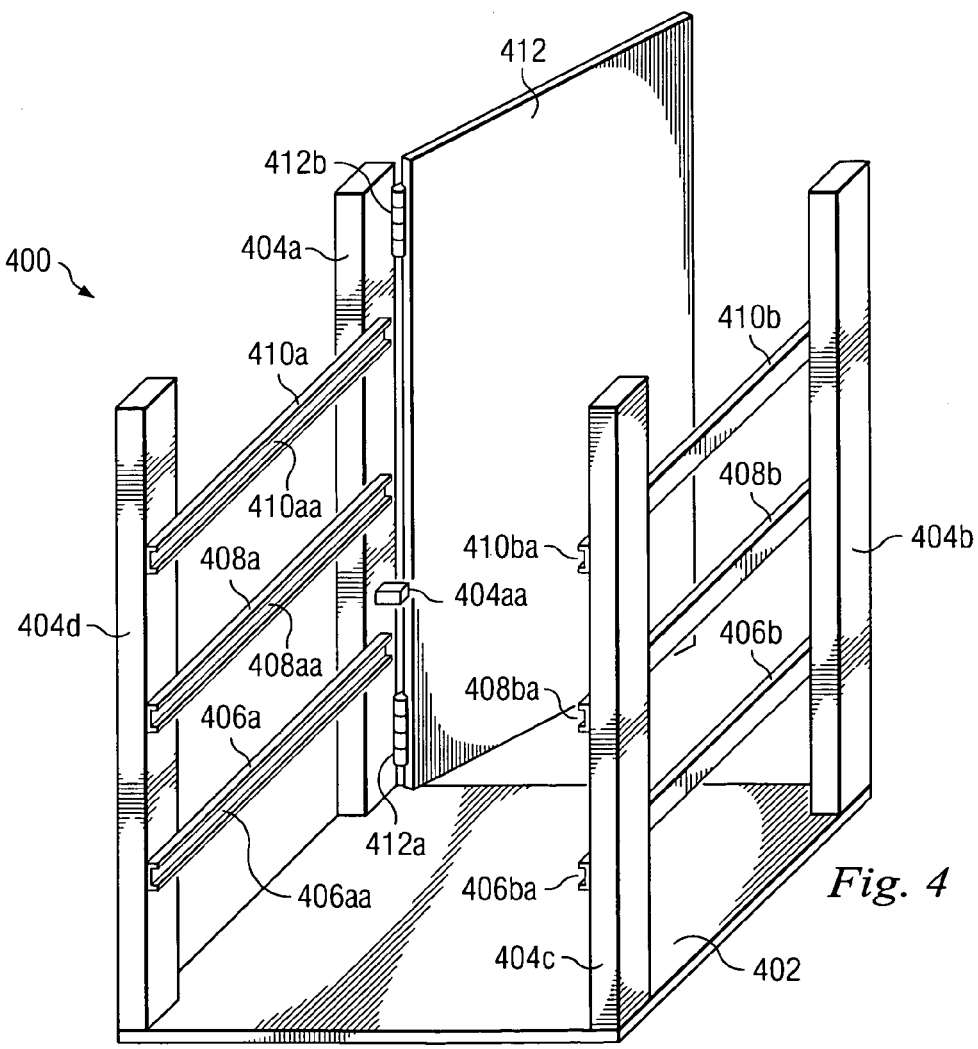

Referring now to FIG. 4, an information handling system rack 400 is illustrated. The information handling system rack 400 includes a base 402 having a plurality of support beams 404a, 404b, 404c, and 404d extending from the base 402 and located in a spaced apart relationship at each corner of the base 402. The support beams 404a, 404b, 404c, and 404d extend between the base 402 and a top (not shown) which has been omitted for clarity. The support beam 404a includes a first cable management member coupler 404aa extending from the support beam 404a and located along its length. An information handling system support 406a extends between the support beams 404a and 404d and defines a coupling channel 406aa. An information handling system support 406b extends between the support beams 404b and 404c, is substantially coplanar with the information handling system support 406a, and defines a coupling channel 406ba. An information handling system support 408a extends between the support beams 404a and 404d, is located substantially parallel to and spaced apart from the information handling system support 406a, and defines a coupling channel 408aa. An information handling system support 408b extends between the support beams 404b and 404c, is located substantially parallel to and spaced apart from the information handling system support 406b, is substantially coplanar with the information handling system support 408a, and defines a coupling channel 408ba. An information handling system support 410a extends between the support beams 404a and 404d, is located substantially parallel to and spaced apart from the information handling system support 408a, and defines a coupling channel 410aa. An information handling system support 410b extends between the support beams 404b and 404c, is located substantially parallel to and spaced apart from the information handling system support 408b, is substantially coplanar with the information handling system support 410a, and defines a coupling channel 410ba. A rack door 412 is pivotally coupled to the support arm 404a by a plurality of hinges 412a and 412b.

Figure 5:
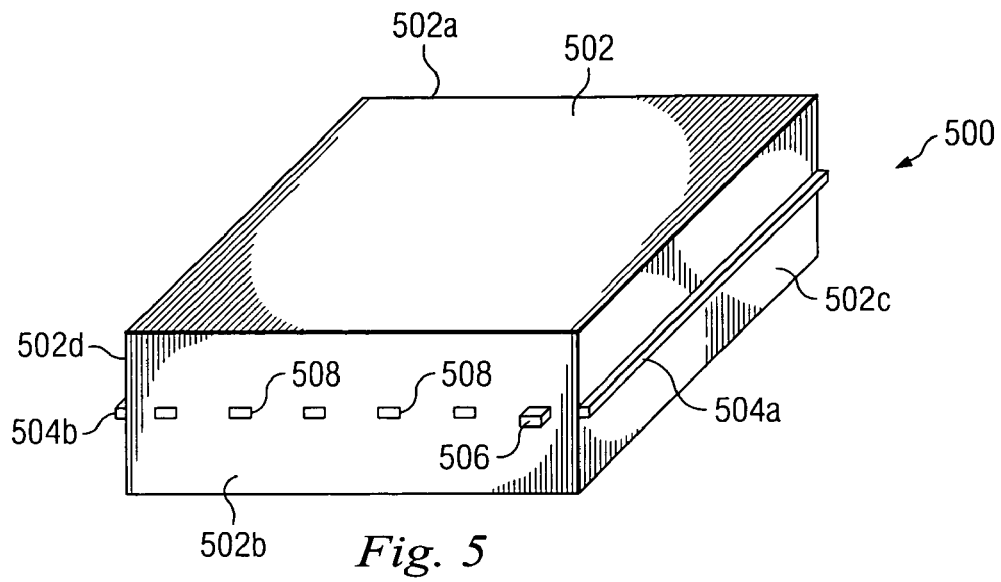
FIG. 5 is a perspective view illustrating an embodiment of an information handling system used with the first cable management member of FIG. 2a, the second cable management member of FIG. 3a, and the information handling system rack of FIG. 4.

Referring now to FIG. 5, an information handling system 500 is illustrated. In an embodiment, the information handling system 500 may be the information handling system 100, described above with reference to FIG. 1. The information handling system 500 includes a chassis 502 having a front surface 502a, a rear surface 502b located opposite the front surface 502a, and a plurality of side surfaces 502c and 502d extending between the front surface 502a and the rear surface 502b. In an embodiment, the chassis 502 may be the chassis 116, described above with reference to FIG. 1, and may house some or all of the component of information handling system 100, described above with reference to FIG. 1. A rack coupling member 504a extends from the side surface 502c of the chassis 502 and along the length of the chassis 502 from the front surface 502a to the rear surface 502b. A rack coupling member 504b extends from the side surface 502d of the chassis 502 and along the length of the chassis 502 from the front surface 502a to the rear surface 502b. A second cable management member coupler 506 extends from the rear surface 502b of the chassis 502 and is located adjacent the side surface 502c. A plurality of cable couplers 508 are located in a spaced apart relationship along the rear surface 502b of the chassis 502.

Referring now to FIGS. 4, 6a, 6b, and 6c, a method 600 for cable management is illustrated. The method 600 begins at step 602 where the information handling system rack 400, described above with reference to FIG. 4, is provided. The method 600 then proceeds to step 604 where the second cable management member 300 is pivotally coupled to the first cable management member 200. The second cable management member 300 is positioned above the first cable management member 200 such that the first member pivotal coupling 306 on second cable management member 300 is positioned above the second member pivotal coupling 206 on first cable management member 200. The first member pivotal coupling 306 may then be pivotally coupled to the second member pivotal coupling 206 using convention methods known in the art. With the first member pivotal coupling 306 coupled to the second member pivotal coupling 206, the second cable management member 300 may pivotal relative to the fist cable management member 200 about the first member pivotal coupling 306.

The method 600 then proceeds to step 604, where the first cable management member 200 is pivotally coupled to the information handling system rack 400. The first cable management member 200 and the second cable management member 300 are positioned in the information handling system rack 400 such that the first cable management member 200 is between the information handling system supports 406a and 408a and adjacent the first cable management member coupler 404aa. The rack pivotal coupling 208a on rack coupler 208 may then be coupled to the first cable management member coupler 404aa using conventional methods known in the art, as illustrated in FIG. 6b. In an embodiment, the first cable management member 200 may be coupled to the information handling system rack 400 at a variety of different locations on the information handling system rack 400 such as, for example, to a bracket mounted to the information handling system support 406a. With the rack pivotal coupling 208a coupled to the first cable management member coupler 404aa, the first cable management member 200 may be pivoted relative to the information handling system rack 400 about the rack pivotal coupling 208a. The additional pivotal coupling between the first member pivotal coupling 306 and the second member pivotal coupling 206 allows the second cable management member 300 to be pivoted relative to the first cable management member 200 into a vertically stacked orientation designated A, as illustrated in FIGS. 6b and 6c.

Figure 6A:
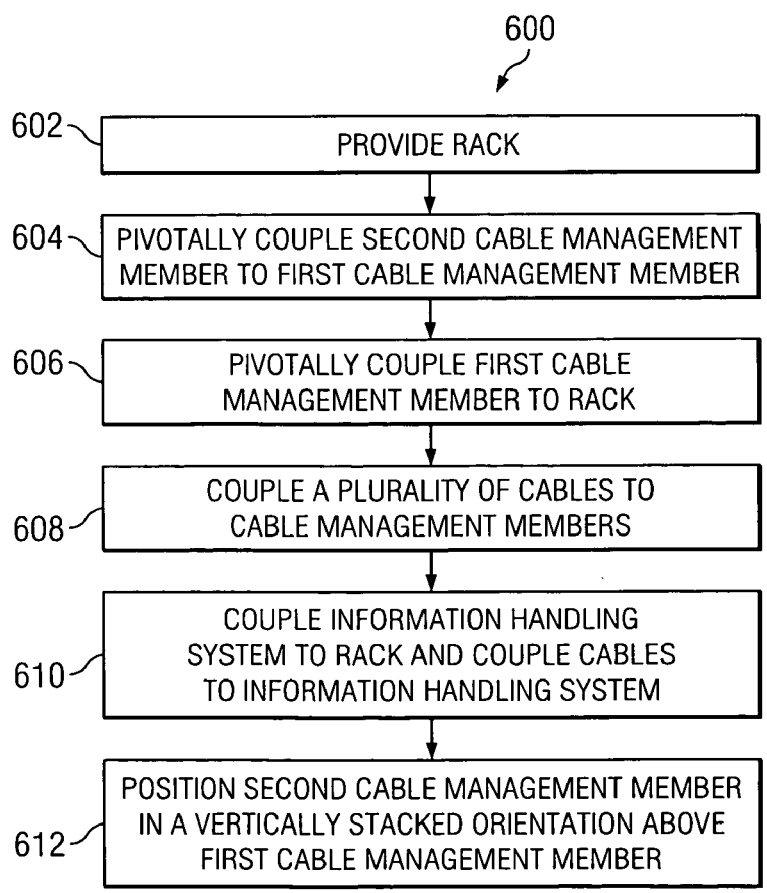
FIG. 6a is a flow chart illustrating an embodiment of a method for cable management.
Figure 6B:
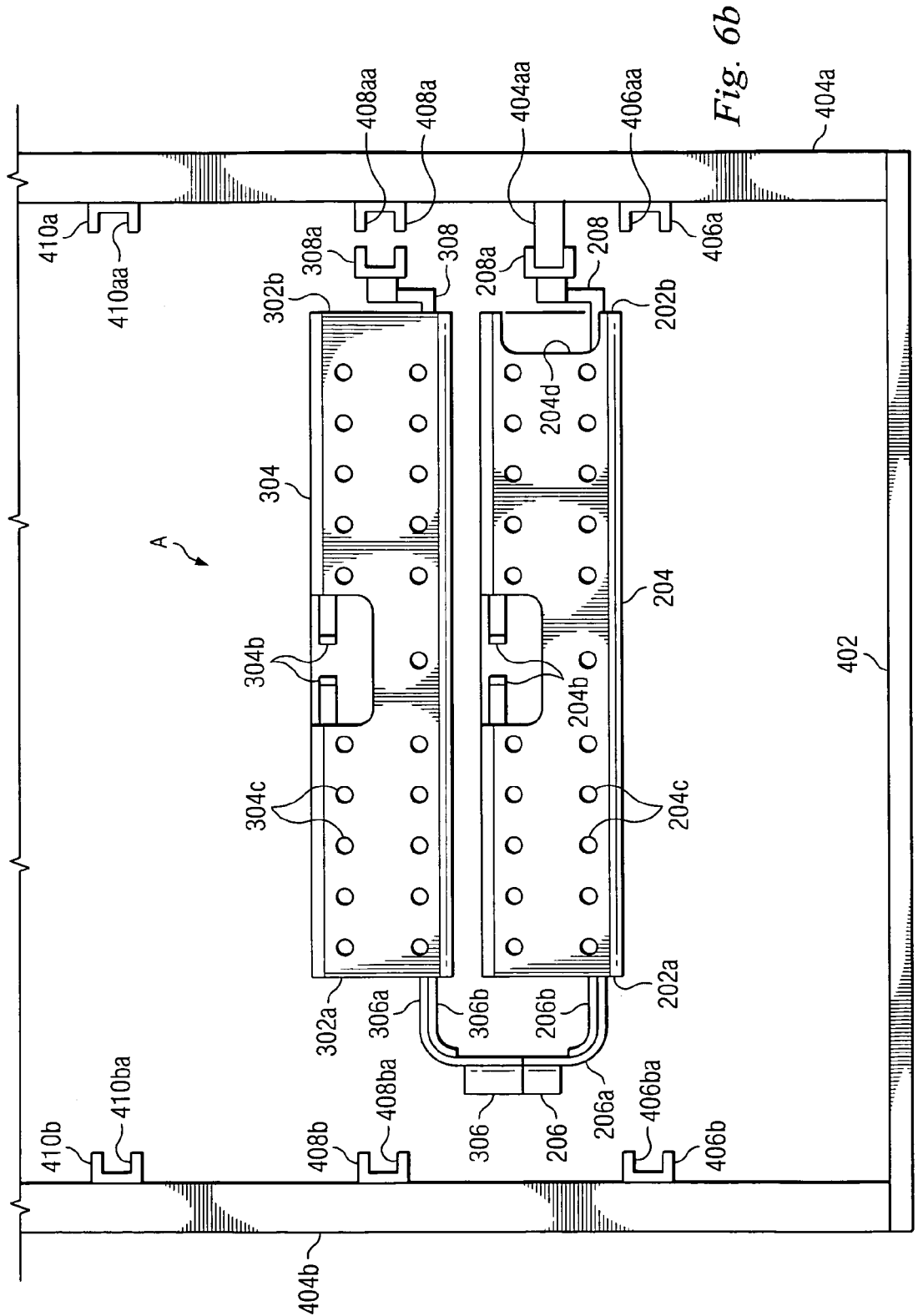
FIG. 6b is a front view illustrating an embodiment of the first cable management member of FIG. 2a and the second cable management member of FIG. 2b coupled to each other and the information handling system rack of FIG. 4.
Figure 6C:
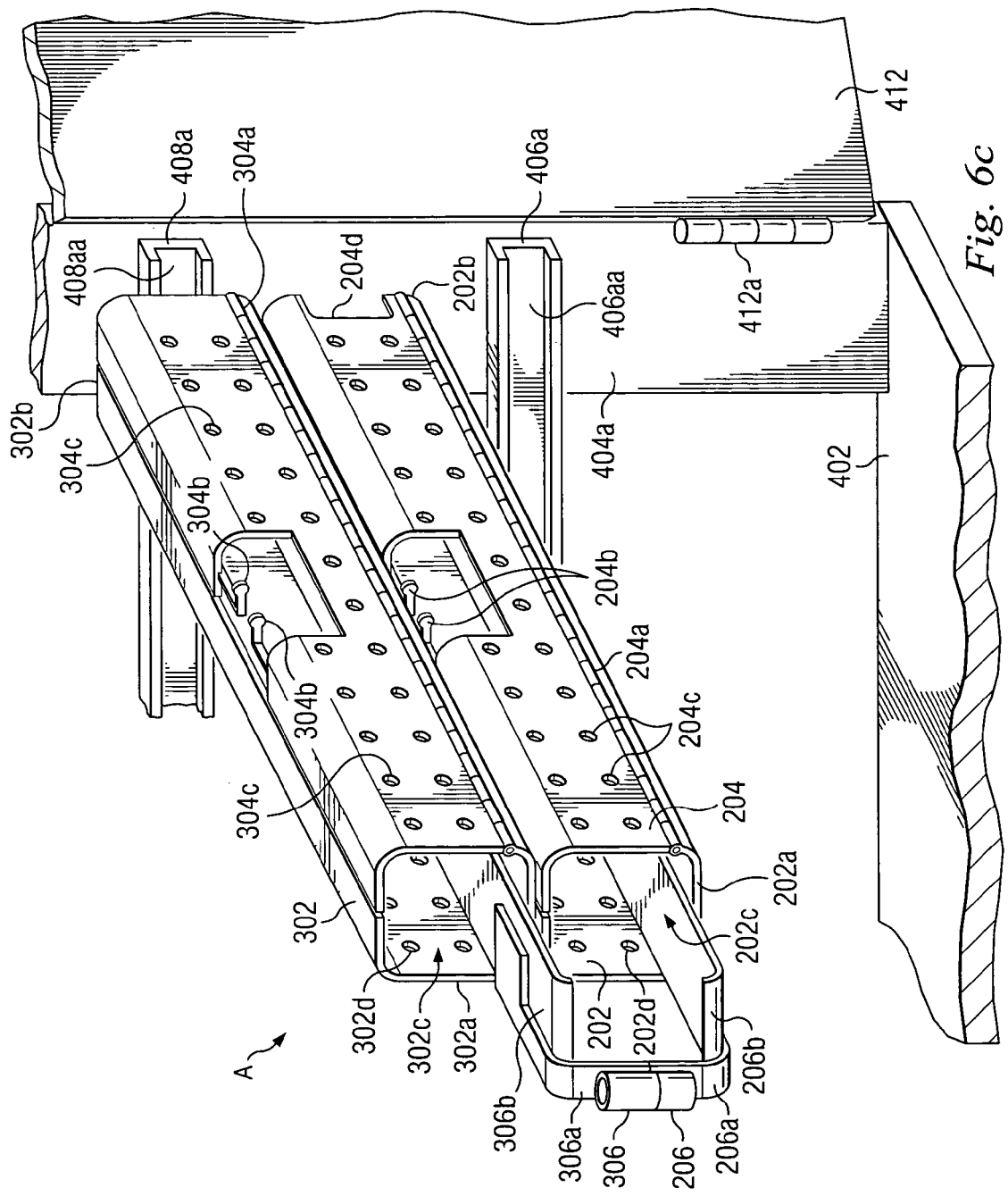
FIG. 6c is a perspective view illustrating an embodiment of the first cable management member of FIG. 2a and the second cable management member of FIG. 2b coupled to each other and the information handling system rack of FIG. 4.
Figure 6D:
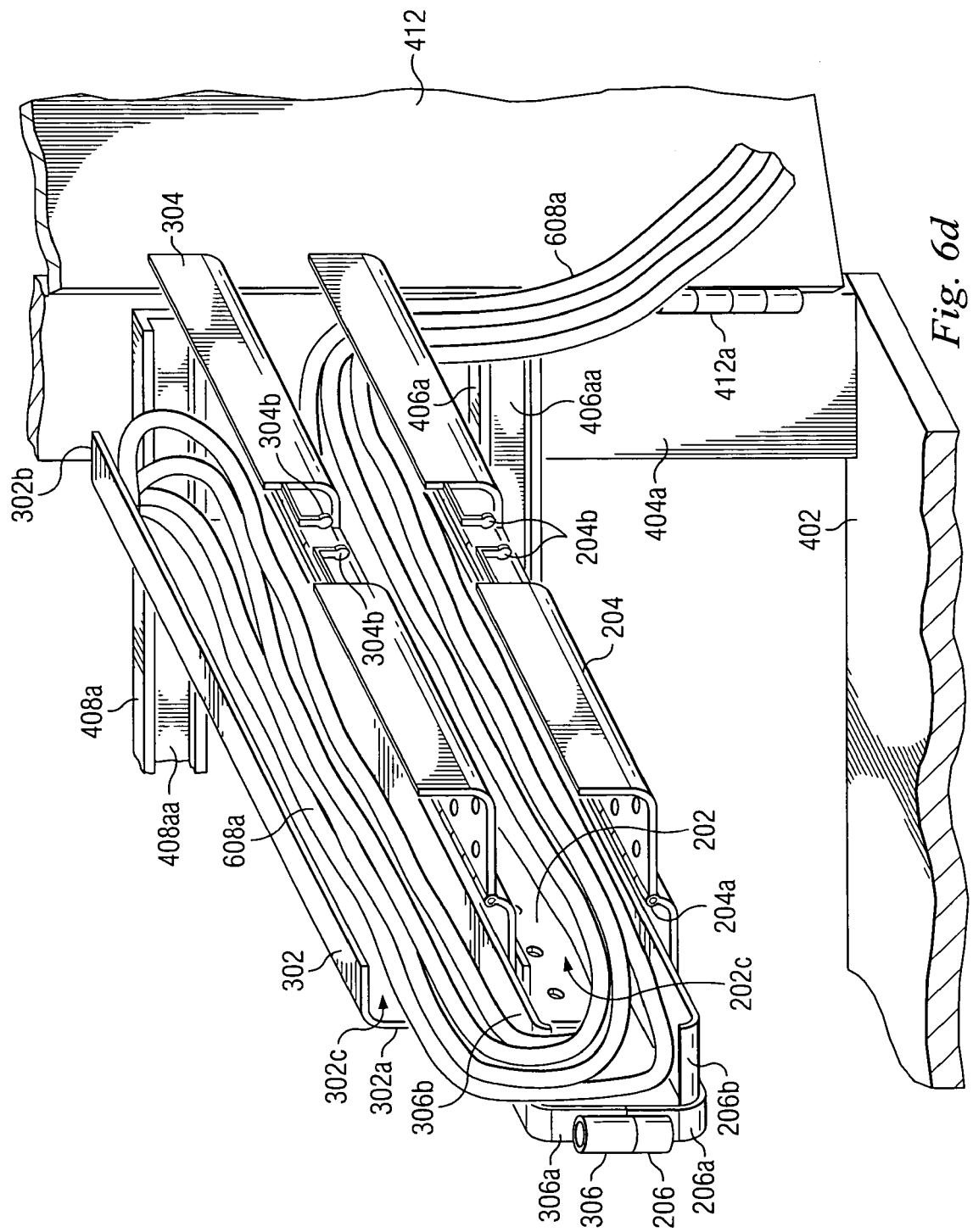
FIG. 6d is a perspective view illustrating an embodiment of a plurality of cables positioned in the first cable management member and the second cable management member of FIG. 6c.
Figure 6F:
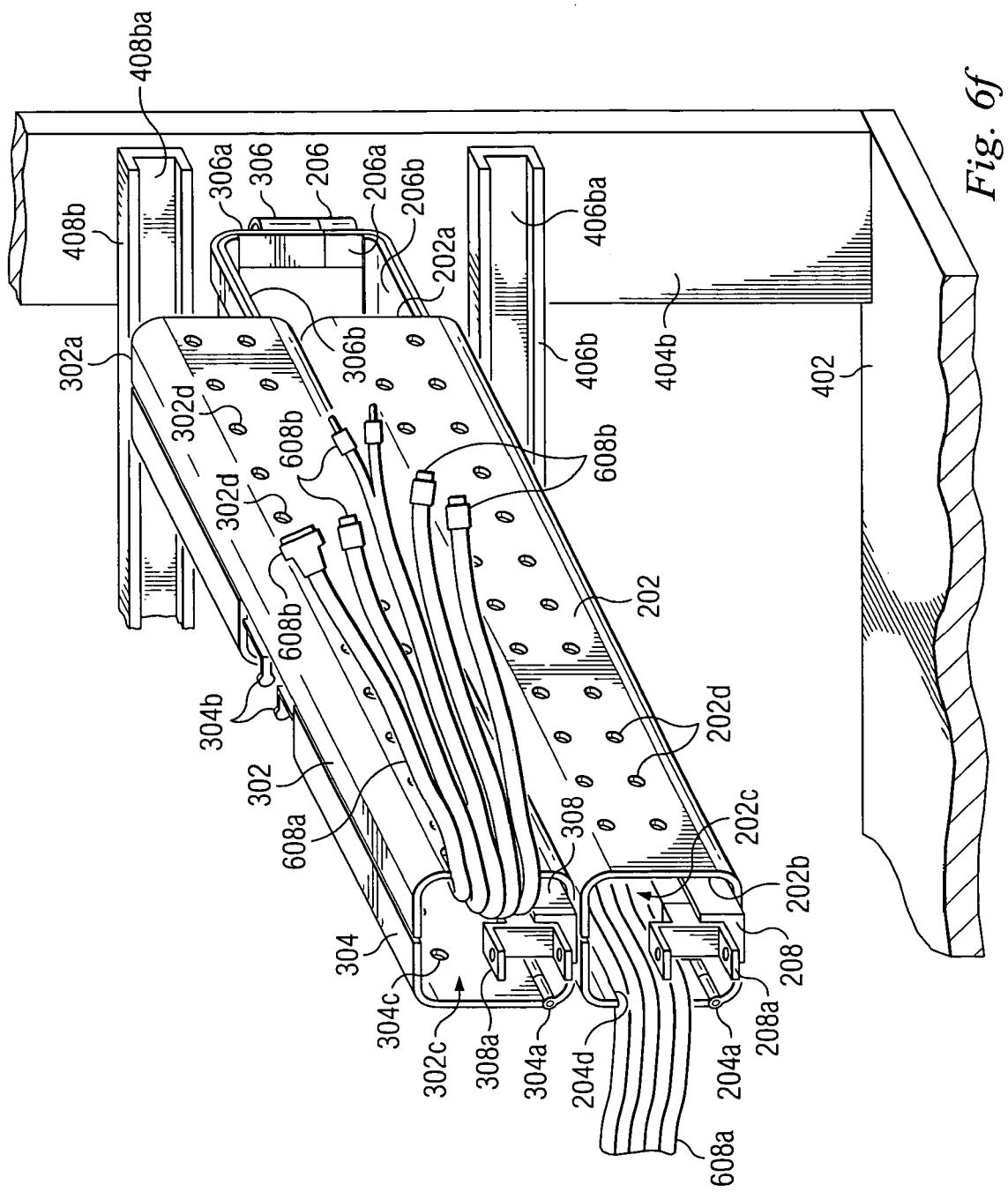
FIG. 6f is a rear perspective view illustrating an embodiment of a plurality of cables coupled to the first cable management member and the second cable management member of FIG. 6c.

Referring now to FIGS. 6a, 6d, 6e, and 6f, the method 600 proceeds to step 608 where a plurality of cables are coupled to the cable management members. The doors 204 and 304 on the first cable management member 200 and second cable management member 300, respectively, are opened by activating the lock and release mechanisms 204b and 304b, respectively, in order to pivot the doors 204 and 304, respectively, about hinges 204a and 304a, respectively, to provide access to the cable passageways 202c and 302c, respectively. A plurality of cables 608a, each cable 608a including an information handing system couplers 608b, are positioned in the cable passageways 202c and 302c such that they are supported by the cable support surfaces 206b and 306b, respectively, as illustrated in FIG. 6d. The doors 204 and 304 may then be pivoted about hinges 204a and 304a, respectively, and secured to the elongated tubular member 202 and 302, respectively, by the lock and release mechanisms 204b and 304b, respectively, as illustrated in FIGS. 6e and 6f. With the doors 204 and 304 secured, the plurality of cables 608a are coupled to the first cable management member 200 and the second cable management member 300, with the plurality of cables 608a entering the first cable management member 200 through the cable entrance 204d, extending through the cable passageway 202c, extending through the cable passageway 302c, and exiting the second cable management member 300 through the cable exit 302e, as illustrated in FIGS. 6e and 6f.

Figure 6G:
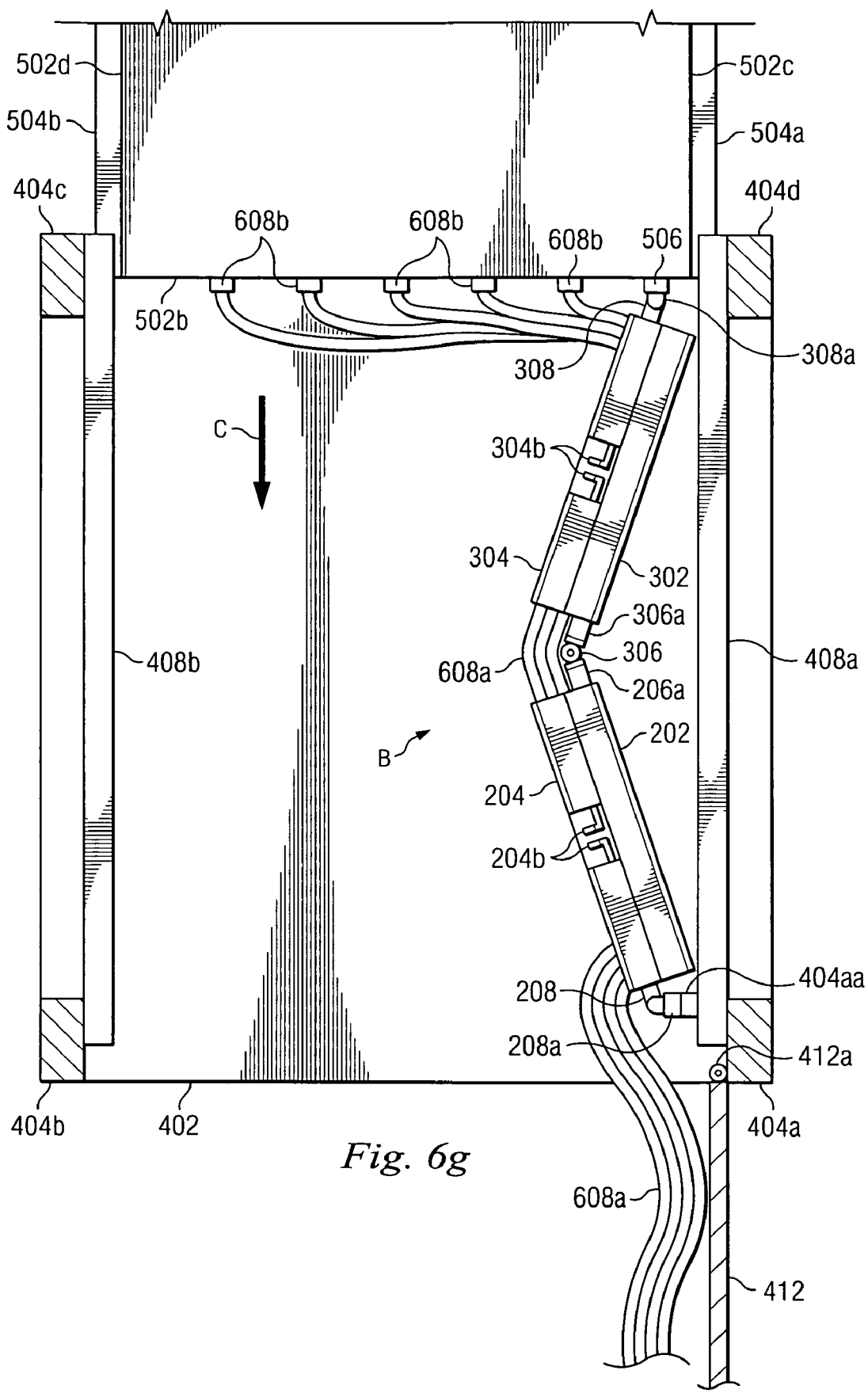
FIG. 6g is a top view illustrating an embodiment of the plurality of cables, the first cable management member, and the second cable management member of FIG. 6e coupled to the information handling system of FIG. 5 and in an extended position.

Referring now to FIGS. 6a and 6g, the method 600 proceeds to step 610 where the information handling system 500 is coupled to the information handling system rack 400 and the plurality of cables 608a are coupled to the information handling system 500. The information handling system 500 is positioned in the information handling system rack 400 such that the rack coupling members 504a and 504b engage the coupling channels 408aa and 408ba, respectively, defined by information handling system supports 408a and 408b, respectively, as illustrated in FIG. 6g. In an embodiment, the information handling system 500 may include a variety of different hardware in place of the rack coupling members 504a and 504b for coupling the information handling systems 500 to the information handling system rack 400. The first cable management member 200 is then pivoted relative to the information handling system rack 400 and the second cable management member 300 is pivoted relative to the first cable management member 200 such that the first cable management member 200 and the second cable management member 300 are positioned in an extended position designated B, illustrated in FIG. 6g. The information handling system pivotal coupling 308a on information handling system coupler 308 of second cable management arm 300 is then coupled to the second cable management member coupler 506 on information handling system 500 using convention methods known in the art such as, for example, a bracket. In an embodiment, the information handling system pivotal coupling 308a on information handling system coupler 308 of second cable management arm 300 may be coupled to translating members on the information handling system support 408a, rather than to the information handling systems 500. With the information handling system pivotal coupling 308a coupled to the second cable management member coupler 506, the second cable management member 300 will pivot relative to the information handling system 500 and the first cable management member 200 when the information handling system 500 moves in the information handling system rack 400, while the first cable management member 300 will pivot relative to the second cable management member 300 and the information handling system rack 400 when the information handling system 500 moves in the information handling system rack 400. The plurality of cables 608a may then be coupled to the information handling system 500 by engaging the information handing system couplers 608b on cables 608a with the cable couplers 508 on the information handling system 500, as illustrated in FIG. 6g.

Figure 6H:
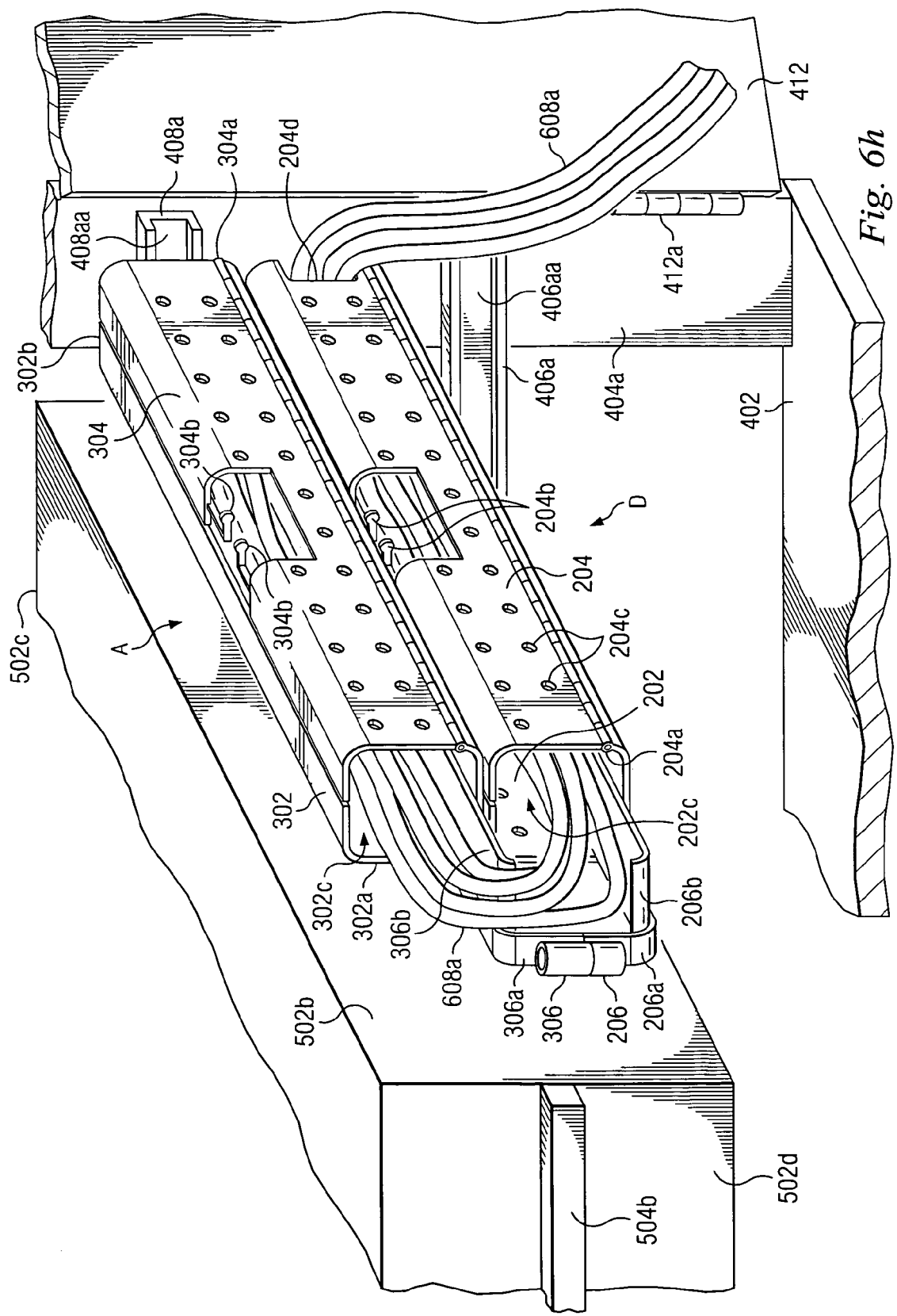
FIG. 6h is a perspective view illustrating an embodiment of the plurality of cables, the first cable management member, and the second cable management member of FIG. 6e coupled to the information handling system of FIG. 5 and in a retracted position.

Referring now to FIGS. 6a, 6g, and 6h, the method 600 proceeds to step 612 where the second cable management member 300 is positioned in the vertically stacked orientation A above the first cable management member 200. The information handling system 400 is moved in a direction designated C in the information handling system rack 400, causing the second cable management member 300 to pivot relative to the information handling system 500 and the first cable management member 200 and causing the first cable management member 300 to pivot relative to the second cable management member 300 and the information handling system rack 400. When the information handling system 400 is positioned fully in the information handling system rack 400, the first cable management member 200 and the second cable management member 300 are positioning in a retracted position designated D, in which the second cable management member 300 is positioned above the first cable management member 200 in the vertically stacked orientation A, as illustrated in FIG. 6h. With the first cable management member 200 and the second cable management member 300 in the retracted position D, the airflow apertures 202d and 204c in first cable management member 200 and the airflow apertures 302d and 304d in second cable management member 300 allow airflow through to the information handling system 500. Thus, a method and apparatus are provided which allow the routing of a plurality of cables 608a using a minimal amount of space behind the information handling system 500 which are easy to use, do not block airflow through the information handling system 500, allow for the information handling system 500 to be cycled in and out of the information handling system rack 400, and are compatible with conventional information handling system racks.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A cable management apparatus, comprising:
   a rack including a first and second vertical support;
   a first cable management member extending horizontally between the first and second vertical supports, and having a first end pivotally connected to the first vertical support and a second end adjacent the second vertical support, the second end including a first pivotal coupler extending vertically, the first pivotal coupler being connected to a first support beam including a first cable support surface extending from the first cable management member; and
   a second cable management member having a first end and a second end, the second cable management member extending horizontally between the first and second vertical supports, the first end being adjacent the second vertical support and including a second pivotal coupler extending vertically and operable to pivotally couple with the first pivotal coupler, the second pivotal coupler being connected to a second support beam including a second cable support surface extending from the second cable management member, the second end of the second cable management member being adjacent the first vertical support, whereby the first and second cable management members are stacked vertically in a retracted position adjacent the first and second vertical support.

2. The apparatus of claim 1, wherein the first cable management member comprises a tubular member defining a cable passageway and including a door which provides an entrance to the cable passageway.

3. The apparatus of claim 1, wherein the second cable management member comprises a tubular member defining a cable passageway and including a door which provides an entrance to the cable passageway.

4. The apparatus of claim 1, wherein the first and second cable management members are extendable from their retracted position.

5. The apparatus of claim 4, wherein the second cable management member extendable away from the first and second vertical supports.

6. The apparatus of claim 1, wherein the first cable management member and the second cable management member each define a plurality of airflow apertures along their lengths.

7. The apparatus of claim 1, further comprising:
   an access door mounted adjacent the first and second vertical supports.

8. The apparatus of claim 7, wherein the door is pivotally connected to the first vertical support.

9. An information handling system, comprising:
   an information handling system rack having a first and second vertical support;
   a first cable management member extending horizontally between the first and second vertical supports, and having a first end pivotally connected to the first vertical support and a second end adjacent the second vertical support, the second end including a first pivotal coupler extending vertically, the first pivotal coupler being connected to a first support beam including a first cable support surface extending from the first cable management member; and
   a second cable management member having a first end and a second end, the second cable management member extending horizontally between the first and second vertical supports, the first end being adjacent the second vertical support and including a second pivotal coupler extending vertically and pivotally coupled with the first pivotal coupler, the second pivotal coupler being connected to a second support beam including a second cable support surface extending from the second cable management member, the second end of the second cable management member being adjacent the first vertical support, whereby the first and second cable management members are stacked vertically in a retracted position adjacent the first and second vertical supports.

10. The system of claim 9, wherein the first cable management member comprises a tubular member defining a cable passageway and including a door which provides an entrance to the cable passageway.

11. The system of claim 9, wherein the second cable management member comprises a tubular member defining a cable passageway and including a door which provides an entrance to the cable passageway.

12. The system of claim 9, wherein the first and second cable management members are extendable from their retracted positions.

13. The system of claim 12, wherein the second cable management member is extendable away from the first and second vertical supports.

14. The system of claim 9, wherein a plurality of cables are extended through the first and second cable management members.

15. The apparatus of claim 9, further comprising:
an access door mounted adjacent the first and second vertical supports.

16. The system of claim 15, wherein the door is pivotally connected to the first vertical support.

17. A method for cable management, comprising:
providing a rack including a first and second vertical support;
extending a first cable management member horizontally between the first and second vertical supports, and having a first end pivotally connected to the first vertical support and a second end adjacent the second vertical support, the second end including a first pivotal coupler extending vertically, the first pivotal coupler being connected to a first support beam including a first cable support surface extending from the first cable management member; and providing a second cable management member having a first end and a second end, the second cable management member extending horizontally between the first and second vertical supports, the first end being adjacent the second vertical support and including a second pivotal coupler extending vertically and operable to pivotally couple with the first pivotal coupler, the second pivotal coupler being connected to a second support beam including a second cable support surface extending from the second cable management member, the second end of the second cable management member being adjacent the first vertical support, whereby the first and second cable management members are stacked vertically in a retracted position adjacent the first and second vertical supports.

18. The method of claim 17, further comprising:
a door mounted adjacent the first and second vertical supports.

19. The method of claim 18, wherein the door is pivotally connected to one of the vertical supports.

* * * * *

UNITED STATES PATENT AND TRADEMARK OFFICE
CERTIFICATE OF CORRECTION

| | |
|---|---|
| PATENT NO. | : 7,359,218 B2 |
| APPLICATION NO. | : 11/204659 |
| DATED | : April 15, 2008 |
| INVENTOR(S) | : Allison McGraw |

Page 1 of 1

It is certified that error appears in the above-identified patent and that said Letters Patent is hereby corrected as shown below:

Claim 5, Column 8, Line 35 after member insert --is--.

Claim 15, Column 9, Line 23 delete "apparatus" and insert --system--.

Signed and Sealed this

Twenty-third Day of December, 2008

JON W. DUDAS
*Director of the United States Patent and Trademark Office*